United States Patent
Jiang et al.

(10) Patent No.: US 11,221,555 B2
(45) Date of Patent: Jan. 11, 2022

(54) MASK PLATE, MANUFACTURING METHOD OF PATTERNED FILM LAYER AND MANUFACTURING METHOD OF THIN FILM TRANSISTOR

(71) Applicants: BOE Technology Group Co., Ltd., Beijing (CN); Hefei Xinsheng Optoelectronics Technology Co., Ltd., Anhui (CN)

(72) Inventors: Tao Jiang, Beijing (CN); Botao Song, Beijing (CN); Ling Han, Beijing (CN); Xinyang Tang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 600 days.

(21) Appl. No.: 16/098,045

(22) PCT Filed: Mar. 22, 2018

(86) PCT No.: PCT/CN2018/079958
§ 371 (c)(1),
(2) Date: Oct. 31, 2018

(87) PCT Pub. No.: WO2018/205752
PCT Pub. Date: Nov. 15, 2018

(65) Prior Publication Data
US 2021/0232043 A1    Jul. 29, 2021

(30) Foreign Application Priority Data
May 9, 2017    (CN) .......................... 201710321666.0

(51) Int. Cl.
*G03F 1/38*    (2012.01)
*H01L 27/12*    (2006.01)
(Continued)

(52) U.S. Cl.
CPC .................. *G03F 1/38* (2013.01); *G03F 7/40* (2013.01); *H01L 27/1288* (2013.01); *H01L 29/66742* (2013.01)

(58) Field of Classification Search
CPC ....... G03F 1/38; G03F 7/40; H01L 29/66742; H01L 27/1288
(Continued)

(56) References Cited

U.S. PATENT DOCUMENTS

2015/0301443 A1    10/2015   Li

FOREIGN PATENT DOCUMENTS

| CN | 101359690 A | 2/2009 |
| CN | 103969940 A | 8/2014 |

(Continued)

OTHER PUBLICATIONS

Jeong, Mask and Method for Manufacturing Display Substrate By Using the Same, May 16, 2008, English Machine Translation (Year: 2008).*

(Continued)

*Primary Examiner* — Caleen O Sullivan
(74) *Attorney, Agent, or Firm* — Banner & Witcoff, Ltd.

(57) ABSTRACT

A mask plate, a method for manufacturing a patterned film layer and a manufacturing method of a thin film transistor are provided by the embodiments of the present disclosure. The mask plate includes: a first pattern and a second pattern; the first pattern includes a first sidewall, a second sidewall, a connecting portion connecting the first sidewall and the second sidewall, and an extension portion on a side of the connecting portion away from the first sidewall; the second pattern is between the first sidewall and the second sidewall; a slit is between the first pattern and the second pattern, and the slit is configured for diffraction. The positive photoresist is used, the extension portion of the mask plate makes that (Continued)

the pattern of the photoresist formed by the mask plate with the extension portion has a region corresponding to the extension portion and the "bolt effect" is avoided.

18 Claims, 5 Drawing Sheets

(51) Int. Cl.
*G03F 7/40* (2006.01)
*H01L 29/66* (2006.01)

(58) Field of Classification Search
USPC .............................................................. 430/5
See application file for complete search history.

(56) References Cited

FOREIGN PATENT DOCUMENTS

| CN | 107132727 A | 9/2017 |
|---|---|---|
| KR | 1020080043165 A | 5/2008 |

OTHER PUBLICATIONS

May 22, 2018—(WO) International Search Report and the Written Opinion Appn PCT/CN2018/079958 with English Translation.

\* cited by examiner

MASK PLATE, MANUFACTURING METHOD OF PATTERNED FILM LAYER AND MANUFACTURING METHOD OF THIN FILM TRANSISTOR

The application is a U.S. National Phase Entry of International Application No. PCT/CN2018/079958 filed on Mar. 22, 2018, designating the United States of America and claiming priority to Chinese Patent Application No. 201710321666.0 filed on May 9, 2017. The present application claims priority to and the benefit of the above-identified applications and the above-identified applications are incorporated by reference herein in their entirety.

TECHNICAL FIELD

The embodiments of the present disclosure relate to a mask plate, a method for manufacturing a patterned film layer and a method for manufacturing a thin film transistor.

BACKGROUND

In the process of manufacturing display devices, for example, the process of manufacturing a liquid crystal display (LCD) comprises: providing a first electrode and a second electrode, and forming a liquid crystal layer with a thickness of 3 μm to 4 μm between the first electrode and the second electrode. In this way, an electric field in the liquid crystal layer is controlled by changing a voltage applied between the first electrode and the second electrode to regulate the intensity of light transmitted through the LCD, thus, a gray scale picture between full bright and full dark is formed. At present, the LCD mainly comprises a color filter, a thin film transistor (TFT) array substrate and a backlight module. The voltage of each pixels in the pixel array of the LCD is controlled by the TFT, which makes the light produced by the backlight module have different colors. Each film layer in the pixel arrays are formed by depositing a plurality of films, exposing by masks, etching operations, and so on.

In the process of forming a pixel array, an accuracy level of forming each film layers is higher. For example, in order to ensure the strength of current and increase the ratio of width to height, U-shaped grooves are usually formed in the conductive material layer. In the process of forming the U-shaped grooves, mask plates with U-shaped patterns are needed. The mask plates with U-shaped patterns are used to form U-shaped photoresist patterns or photoresist patterns complementary to the U-shaped patterns, and then U-shaped film patterns are formed on the films to be patterned by etching, thereby a pixel array is formed.

SUMMARY

At least one embodiment of the present disclosure provides a mask plate, and the mask plate comprises: a first pattern and a second pattern; the first pattern comprises a first sidewall, a second sidewall, a connecting portion connecting both the first sidewall and the second sidewall, and an extension portion on a side of the connecting portion away from the first sidewall; the second pattern is between the first sidewall and the second sidewall; a slit is between the first pattern and the second pattern, and the slit is configured for diffraction.

For example, in the mask plate provided by at least one embodiment of the present disclosure, a plurality of first patterns and a plurality of second patterns are provided, and the plurality of first patterns are in one to one correspondence with the plurality of second patterns.

For example, in the mask plate provided by at least one embodiment of the present disclosure, the plurality of the first patterns are connected to each other.

For example, in the mask plate provided by at least one embodiment of the present disclosure, a plurality of extension portions are provided, and each of the first patterns is provided with one of the extension portions.

For example, in the mask plate provided by at least one embodiment of the present disclosure, the extension portion is connected to a center of the connecting portion.

For example, in the mask plate provided by at least one embodiment of the present disclosure, the extension portion is an L-shaped structure.

For example, in the mask plate provided by at least one embodiment of the present disclosure, the first sidewall and the second sidewall are parallel to each other, and a width of the extension portion in a direction perpendicular to the first sidewall and the second sidewall is 1/10 to 1/2 of a distance between the first sidewall and the second sidewall.

For example, in the mask plate provided by at least one embodiment of the present disclosure, a width of the slit is from 1.9 μm to 2.4 μm.

For example, in the mask plate provided by at least one embodiment of the present disclosure, the width of the slit is from 2.1 μm to 2.3 μm.

At least one embodiment of the present disclosure further provides a method for manufacturing a patterned film layer, and the method comprises: depositing a film to be patterned and a photoresist film in sequence; patterning the photoresist film to form a photoresist pattern by using any one of the mask plates described above, and the photoresist pattern comprises a photoresist-completely-retained region, a photoresist-partially-retained region, and a photoresist-completely-removed region; hot baking the photoresist pattern, wherein a photoresist corresponding to the extension portion of the mask plate flows to a position corresponding to a region between the connecting portion and the second pattern of the mask plate; etching the film to be patterned corresponding to the photoresist-completely-removed region; ashing the photoresist-partially-retained region to remove the photoresist in the photoresist-partially-retained region; etching the film to be patterned corresponding to the photoresist-partially-retained region to form the patterned film layer.

For example, in the manufacturing method provided by at least one embodiment of the present disclosure, the photoresist-completely-retained region corresponds to the first pattern and the second pattern of the mask plate, and the photoresist-partially-retained region corresponds to the slit of the mask plate.

For example, in the manufacturing method provided by at least one embodiment of the present disclosure, a thickness of the photoresist in the photoresist-partially-retained region is 1/4 to 1/2 of a thickness of the photoresist in the photoresist-completely-retained region.

For example, in the manufacturing method provided by at least one embodiment of the present disclosure, before hot baking the photoresist pattern, the photoresist in the photoresist-partially-retained region has a first portion and a second portion with different thicknesses.

For example, in the manufacturing method provided by at least one embodiment of the present disclosure, the first portion corresponds to a gap between the first sidewall and the second pattern of the mask plate, a gap between the second sidewall and the second pattern; and the second portion corresponds to a gap between the connecting portion and the second pattern of the mask plate.

For example, in the manufacturing method provided by at least one embodiment of the present disclosure, a thickness difference between the first portion and the second portion is from 50 nm to 100 nm.

For example, in the manufacturing method provided by at least one embodiment of the present disclosure, after the patterned film layer is formed, the manufacturing method further comprises: removing a portion of the patterned film layer corresponding to the extension portion of the mask plate.

For example, in the manufacturing method provided by at least one embodiment of the present disclosure, the patterned film layer is a conductive film, an organic insulating layer or an inorganic insulating layer.

At least one embodiment of the present disclosure further provides a method for manufacturing a thin film transistor, and the method comprises: forming the patterned film layer by any one of the manufacturing methods mentioned above.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may comprise an electrical connection which is direct or indirect. The terms "on," "under," "right," "left" and the like are only used to indicate relative position relationship, and in the case that the position of an object is described as being changed, the relative position relationship may be changed accordingly.

Figure 1:
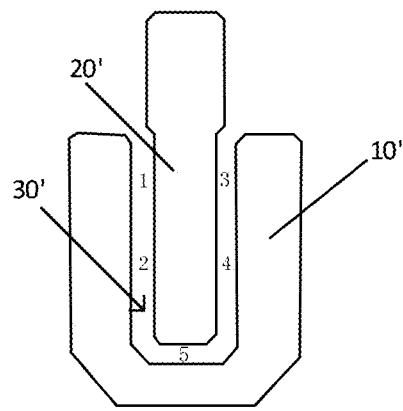
FIG. 1 is a schematic diagram of a structure of a mask plate with a U-shaped groove used for forming a pixel structure.

FIG. 1 is a schematic diagram of a structure of a mask plate with a U-shaped groove used for forming a pixel structure. As illustrated in FIG. 1, in the mask plate 100, a U-shaped pattern 10' and a cylindrical pattern 20' inserted into the U-shaped pattern 10' form a U-shaped groove 30'. The U-shaped groove 30' in FIG. 1 located at positions labeled by 1, 2, 3, 4, and 5.

However, at the tip (at position 5) of the U-shaped groove 30', because the shape of the gap at this position is different from that at other positions (positions 1, 2, 3, 4), more diffraction light is transmitted through the gap of the mask plate, which leads to the exposure amount of the photoresist in the corresponding region below the mask plate is large, and the photoresist is thin after the exposure. Seriously, all the photoresist in the position is developed, which leads to the pixel arrays manufactured on the conductive material layers are unqualified.

For example, in the process of manufacturing a display device, a density and a number of the thin film transistors in a functional region (Gate On Array, GOA region) are larger than those in an active area (AA) of a display device, in this way, a concentration of the developer in the functional region is larger, therefore, the photoresist in the functional region is more likely to be fully developed (PR open).

In order to increase the machining accuracy, a method for fabricating the pixel array by using a single slit diffraction mask (SSM) plate is proposed. The SSM plate is a mask plate with a slit width between 1.9 μm and 2.4 μm. For the SSM plate, by using the principle of diffracting light, the gap in the groove position of the mask plate is made very narrow, in this way, light can only be transmitted in a diffraction manner, therefore, the exposure amount of the photoresist in the region is reduced, and the photoresist is thinned. Because the SSM plate is exposed by adopting the principle of diffracting light, the exposure accuracy is require to be high. How to ensure the uniformity of the thickness of the photoresist corresponding to the slit after exposure is a difficult problem in the embodiment of the present disclosure.

Figure 2:
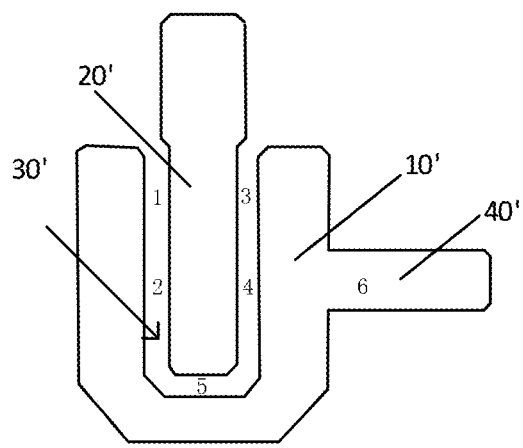
FIG. 2 is a connection diagram of a source connection line which leads to a "bolt effect"
Figure 3:
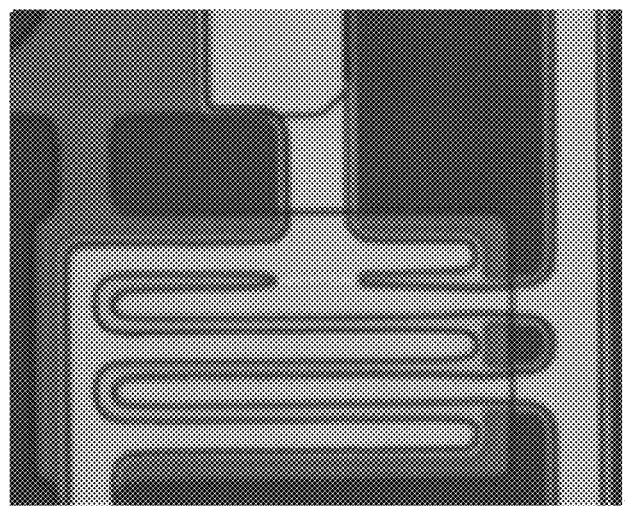
FIG. 3 is a schematic diagram of channel short circuit caused by the bolt effect.

For example, in the process of forming a pixel structure, "bolt effect" needs to avoid, the following is illustrated by referring to FIG. 2. FIG. 2 is a TFT pixel pattern that is easy to generate "bolt effect". The source electrode of the TFT not illustrated in FIG. 2 is connected to the signal lines by the connection line 40' (at position 6), and the slit adjacent to the source electrode is located at position 4. The process of forming the pixel structure by the mask plate includes: cleaning a base substrate, coating a film on the base substrate, exposing the film, developing the film, and hot baking the film. Because the photoresist is deformed in the process of hot baking, the photoresist at the junction line (at position 6) is prone to hot deforming and flowing to the photoresist at position 4, in this way, the thickness of the photoresist at position 4 is increased, which is called as the "bolt effect". FIG. 3 is a schematic diagram of channel short circuit caused by the bolt effect. As illustrated in FIG. 3, the problem of channel short circuit is occurred. Due to the unexpected problem of channel short circuit is occurred in the process of manufacturing a pixel structure, the design method is abandoned in the usual design.

The embodiments of the present disclosure provide a mask plate, a method for manufacturing a patterned film layer and a method for manufacturing a thin film transistor. By improving the design of the mask plate, an extension portion is added at the center of the bottom of the first pattern, in a case that the positive photoresist is used, the pattern of the photoresist formed by the mask plate also has an extension portion, thus the "bolt effect" is avoided. In the process of hot baking the formed photoresist pattern, the photoresist corresponding to the extension portion of the mask plate is hot baked and flows to a region corresponding to the gap between the bottom of the first pattern and the second pattern of the mask plate, thus, the integrity of the photoresist pattern after exposure is guaranteed, and the problem that more diffraction light transmitted through the gap at the tip is avoided due to the shape of the gap at the tip of the U-shaped groove of the mask plate is different from that at other positions, and further the problem that the photoresist corresponding to the tip of the U-shaped groove of the mask plate is prone to be broken due to the region has a large exposure amount and the photoresist is thinner after exposure.

Figure 4:
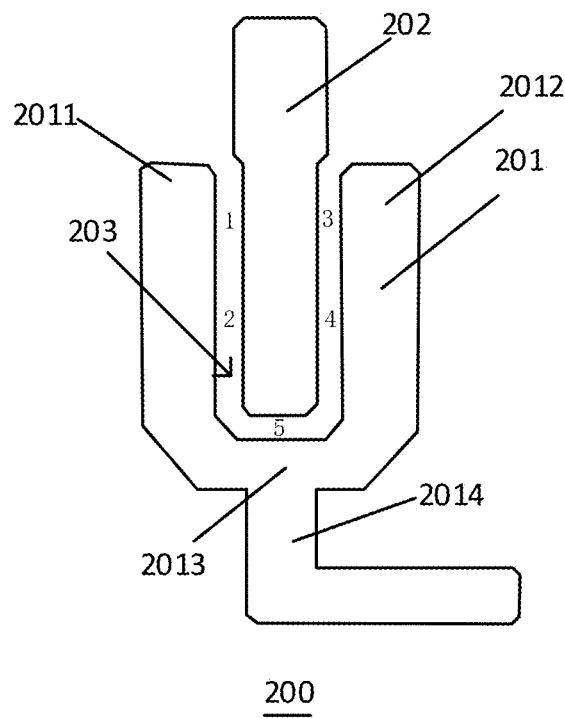
FIG. 4 is a schematic diagram of a structure of a mask plate provided by an embodiment of the present disclosure.

At least one embodiment of the present disclosure provides a mask plate, for example, as illustrated in FIG. 4, the mask plate 200 comprises: a first pattern 201 and a second pattern 202; the first pattern 201 comprises a first sidewall 2011, a second sidewall 2012, a connecting portion 2013 connecting both the first sidewall 2011 and the second sidewall 2012, and an extension portion 2014 on a side of the connecting portion 2013 away from the first sidewall 2011; the second pattern 202 is between the first sidewall 2011 and the second sidewall 2012; a slit 203 is between the first pattern 201 and the second pattern 202, and the slit 203 is configured for light diffraction.

For example, the slit 203 is a U-shaped slit, a width of the slit is from 1.9 μm to 2.4 μm. For example, the slit 203 comprises a position 1, a position 2, a position 3, a position 4 and a position 5.

For example, the width of the slit is from 2.1 μm to 2.3 μm. For example, the slit 203 comprises the position 1, the position 2, the position 3, the position 4 and the position 5.

For example, the interior of the first pattern 201 is substantially a U-shaped pattern for matching with the second pattern 202 so as to form a U-shaped slit, and the shape of the first pattern 201 is not particularly limited. For example, the outer portion of the first pattern 201 is not limited to the U-shaped outer contour as illustrated in FIG. 4.

For example, the position where the extension portion 2014 connected to the connecting portion 2013 is not limited, for example, the extension portion 2014 is connected to the center of the connecting portion 2013.

For example, the extension portion 2014 includes a corner which makes that a portion of the extension portion 2014 extends toward the second sidewall 2012.

For example, the extension portion 2014 is in an "L" shape.

For example, the first sidewall 2011 and the second sidewall 2012 are parallel to each other, and a width of the extension portion 2014 in a direction perpendicular to the first sidewall 2011 and the second sidewall 2012 is $1/10$ to $1/2$ of a distance between the first sidewall 2011 and the second sidewall 2012.

For example, the width of the extension portion 2014 in a direction perpendicular to the first sidewall 2011 and the second sidewall 2012 is $1/10$, $1/8$, $1/6$, $1/4$ or $1/2$ of the distance between the first sidewall 2011 and the second sidewall 2012.

Figure 5:
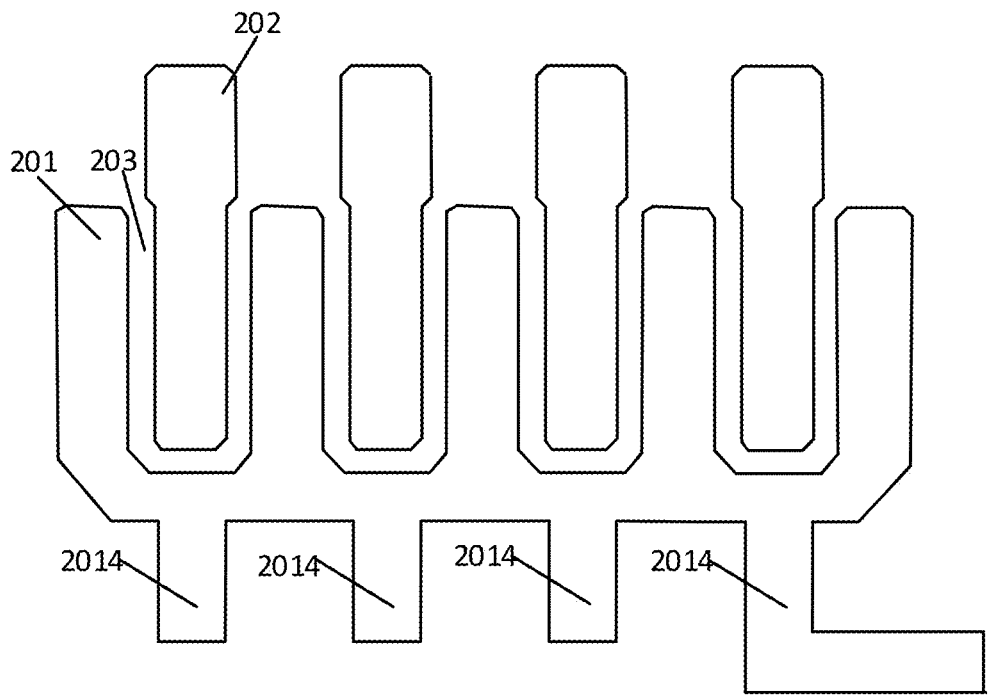
FIG. 5 is another schematic diagram of a structure of a mask plate provided by an embodiment of the present disclosure in which a plurality of first patterns are connected with each other.

For example, FIG. 5 is another schematic diagram of a mask plate provided by an embodiment of the present disclosure in which a plurality of first patterns are connected with each other. As illustrated in FIG. 5, a plurality of first patterns 201 and a plurality of second patterns 202 are provided, and the plurality of first patterns 201 are in one to one correspondence with the plurality of second patterns 202, each of the second patterns 202 is at least partially located in the first pattern 201.

For example, the plurality of first patterns 201 are connected with each other to form a first pattern 201 arranged side by side, and the adjacent first patterns 201 share a same sidewall. For example, the second sidewall of the first pattern 201 on the left side shares a same sidewall with the first sidewall of the first pattern 201 on the right side.

For example, in the practical process, more than one first pattern are formed on the pattern of a same layer to be patterned. For example, the density and the number of the thin film transistors in a functional region (Gate On Array, GOA region) are different from those in an active area (AA) of the display device, in this way, the density of the thin film transistors in the functional region is larger than the density of the thin film transistors in the active area (AA) of the display device. Therefore, the mask plate for forming a photoresist pattern includes a plurality of first patterns connected with each other and extension portions connected to the bottom of each first patterns, the shapes of the extension portions are the same or different from each other.

For example, a plurality of extension portions 2014 are provided, and each of the first patterns 201 is provided with one of the extension portions 2014.

For example, the extension portions 2014 are connected to centers of the connecting portions 2013 respectively.

For example, in a case that the mask plate is used for forming a photoresist pattern, the photoresist pattern corresponding the extension portions located at the center of the bottom of the first pattern of the mask plate is hot baked, the hot baked photoresist evenly flows to the center or the vicinity of the center of the region corresponding to the bottom of the first pattern, thus the problem of photoresist breakage is avoided.

For example, the first sidewall 2011 and the second sidewall 2012 of each of the first patterns 201 are parallel to each other, and the width of each extension portion 2014 in a direction perpendicular to the first sidewall 2011 and the second sidewall 2012 is $1/10$ to $1/2$ of the distance between the first sidewall 2011 and the second sidewall 2012.

For example, the width of the extension portion 2014 in the direction perpendicular to the first sidewall 2011 and the second sidewall 2012 is $1/10$, $1/8$, $1/6$, $1/4$ or $1/2$ of the distance between the first sidewall 2011 and the second sidewall 2012.

It should be noted that, the shape of the extension portion of the mask plate for forming the photoresist pattern is not particularly limited, as long as the photoresist corresponding to the extension portion of the mask plate flows to the bottom of the first pattern after hot baking, and then the compensation of photoresist is realized. Thus, for example, the shape of the extension portion is a rectangle, an ellipse, a cone, a square, a circle, a water drop or an irregular shape.

For example, the extension portion 2014 is located at an entire bottom of the first pattern 201, that is, the width of the extension portion 2014 is the same or substantially the same as the width of the connecting portion 2013; or the width of the extension portion 2014 is slightly shorter than the width of the whole bottom of the first pattern 201, that is, the width of the extension portion 2014 is less than the width of the connecting portion 2013.

In addition, the experiment proves that the compensation effect is good in a case that the width of the extension portion 2014 of the mask plate is more than $1/5$ of the width of the bottom of the first pattern 201 and less than $1/2$ of the width of the bottom of the first pattern 201; in a case that the width of the extension portion 2014 of the mask plate is less than $1/10$ of the width of the bottom of the first pattern 201, the compensation effect is not obvious, in other words, in a case that the width of the extension portion 2014 of the mask plate is more than $1/5$ of the width of the connecting portion 2013 and less than $1/2$ of the width of the bottom of the first pattern 201, the compensation effect is relatively better. For example, the width of the extension portion 2014 (the width of the extension portion 2014 in the direction perpendicular to the first sidewall 2011 and the second sidewall 2012) is more than $1/5$ of the bottom width of the first pattern 201 (the distance between the first sidewall and the second sidewall which are approximately parallel to each other), and less than $1/2$ of the bottom width of the first pattern 201, or the width of the extension portion 2014 (the width of the extension portion 2014 in the direction perpendicular to the first sidewall 2011 and the second sidewall 2012) is more than $1/10$ of the bottom width of the first pattern 201 (the distance between the first sidewall and the second sidewall which are approximately parallel to each other) and less than $1/2$ of the bottom width of the first pattern 201.

Figure 6:
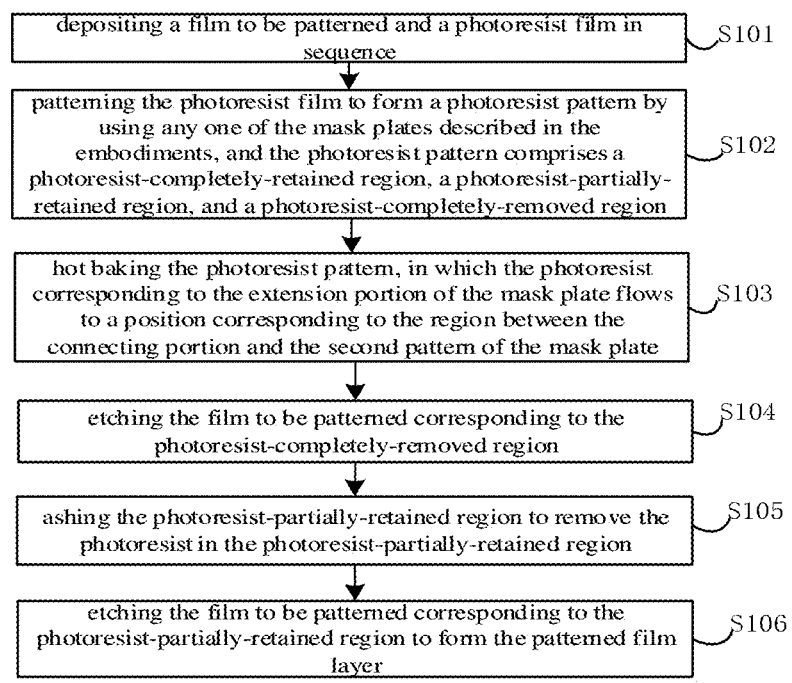
FIG. 6 is a flowchart of a method for manufacturing a patterned film layer provided by an embodiment of the present disclosure.

At least one embodiment of the present disclosure further provides a method for manufacturing a patterned film layer, for example, FIG. 6 is a flowchart of a method for manufacturing a patterned film layer, FIG. 7A to FIG. 7D are flowcharts of the process of manufacturing a patterned film layer provided by an embodiment of the present disclosure. The manufacturing method of the patterned film layer is described below by referring to FIG. 6 and FIGS. 7A to 7D:

S101: depositing a film to be patterned and a photoresist film in sequence.

Figure 7A:
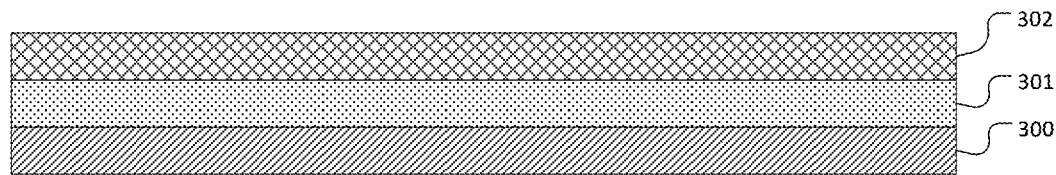
FIG. 7A to FIG. 7D are flowcharts involved in the process of manufacturing a patterned film layer provided by an embodiment of the present disclosure.

For example, as illustrated in FIG. 7A, the film to be patterned 301 is formed on the base substrate 300 by a chemical vapor deposition method or a magnetron sputtering method, and a photoresist film 302 is formed on the film to be patterned 301, then the follow-up operation is carried out. The film to be patterned 301, for example, is a conductive material film, and the photoresist film 301, for example, is a positive photoresist.

S102: patterning the photoresist film 301 to form a photoresist pattern 303 by using any one of the mask plates 200 described in above embodiments, and the photoresist pattern 303 comprises a photoresist-completely-retained region 3031, a photoresist-partially-retained region 3032, and a photoresist-completely-removed region.

Figure 7B:
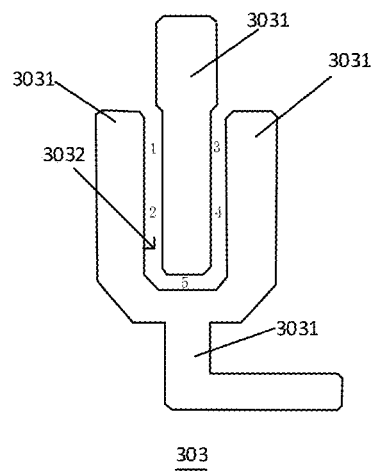
Figure 7C:
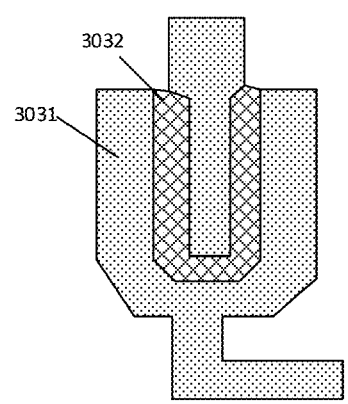

For example, as illustrated in FIG. 7B and FIG. 7C, the photoresist-completely-retained region 3031 corresponds to a region corresponding to the first pattern 201 and the second pattern 202 of the mask plate 200, and the photoresist-partially-retained region 3032 corresponds to the slit 203 of the mask plate 200.

For example, a thickness of the photoresist in the photoresist-completely-retained region 3031 is the same as a thickness of the deposited photoresist film, the thickness of the photoresist in the photoresist-partially-retained region 3032 is reduced, and the photoresist in the photoresist-completely-removed region is completely removed.

For example, the thickness of the photoresist in the photoresist-partially-retained region 3032 is $1/4$ to $1/2$ of the thickness of the photoresist in the photoresist-completely-retained region 3031, for example, the thickness of the photoresist in the photoresist-partially-retained region 3032 is $1/4$, $1/3$ and $1/2$ of the thickness of the photoresist in the photoresist-completely-retained region 3031.

For example, the photoresist in the photoresist-partially-retained region 3032 has a first portion (the portion corresponding to positions 1, 2, 3 and 4) with a large thickness, and a second portion (the portion corresponding to position 5) with a small thickness which is smaller than the thickness of the first portion.

For example, the first portion with a large thickness corresponds to the gap between the first sidewall 2011 and the second pattern 202 (including position 1 and position 2) of the mask plate 200, and the gap between the second sidewall 2012 and the second pattern 202 (including position 3 and position 4) of the mask plate 200. The second portion corresponds to the gap between the connecting portion 2013 and the second pattern 202 of the mask plate (position 5).

For example, a thickness difference between the first portion and the second portion is from 50 nm to 100 nm.

For example, the thickness difference between the first portion and the second portion is approximately 50 nm, 60 nm, 70 nm, 80 nm, 90 nm and 100 nm.

For example, the photoresist pattern is formed by using a photolithography and etching method by a mask transfer process.

For example, firstly, a mask plate is used to cover the photoresist film, the photoresist film is illuminated by ultraviolet light, near ultraviolet light, or any other visible light at wavelengths near 400 nm. For example, the photoresist is a positive photoresist, and performance of the positive photoresist at the position illuminated by light is changed, so that the photoresist-completely-retained region 3031, the photoresist-partially-retained region 3032, and the photoresist-completely-removed region are formed. After the mask plate is removed, the photoresist in the photoresist-completely-removed region is washed out by a chemical cleaning method, then, the film to be patterned corresponding to the photoresist-completely-removed region is removed, and the photoresist in the photoresist-partially-retained region 3032 is ashed to remove the photoresist in the photoresist-partially-retained region 3032 to form the photoresist pattern.

The mask plate used above, for example, is a single slit diffraction mask (SSM) plate, which includes the following patterns: the first pattern, the second pattern matching with the first pattern to form a U-shaped slit, and an extension portion connected to the bottom of the first pattern, and the width of the slit is from 1.9 μm to 2.4 μm. The interior of the first pattern 201 is substantially a U-shaped pattern for forming a U-shaped slit matching with the second pattern 202, and the shape of the first pattern 201 is not particularly limited. For example, the outer portion of the first pattern 201 is not limited to the U-shaped outer contour.

For example, the SSM plate use the principle of diffracting light, and the slit is narrow enough to allow light to be transmitted only in the diffraction manner, therefore, the exposure amount of the photoresist at this region is reduced, and a semi-transparent film is formed.

S103: hot baking the photoresist pattern, in which the photoresist corresponding to the extension portion of the mask plate flows to a position corresponding to the region between the connecting portion and the second pattern of the mask plate.

For example, the photoresist pattern is hot baked, and the photoresist corresponding to the extension portion of the mask plate flows to a position corresponding to the region between the connecting portion and the second pattern of the mask plate, for example, the photoresist corresponding to the connection portion flows to the position 5.

It should be noted that, in the step, the photoresist pattern is baked at such a temperature that the photoresist is capable of flowing, and according to the bolt effect, the extension portion forms a "bolt", and the photoresist corresponding to the extension portion of the mask plate flows to a position corresponding to a region between the connecting portion and the second pattern of the mask plate. The photoresist corresponding to the extension portion of the mask plate flows to the region between the connecting portion and the second pattern, in this way, the thickness of the photoresist at position 5 is thickened, therefore, the problem that the photoresist is prone to be broken due to the large amount of diffraction light transmitted through the gap 5 at the tip of the U-shaped groove of the mask plate after exposure can be solved.

The shape of the extension portion is not particularly limited, as long as the photoresist corresponding to the extension portion of the mask plate flows to the bottom of the first pattern after hot baking, and then the compensation of photoresist is realized. Thus, for example, the photoresist pattern corresponding to the extension portion of the mask plate is a rectangle, an ellipse, a cone, a water drop, a square, a circle, or an irregular shape.

S104: etching the film to be patterned corresponding to the photoresist-completely-removed region.

S105: ashing the photoresist-partially-retained region to remove the photoresist in the photoresist-partially-retained region.

For example, in the step S105, the photoresist in the photoresist-partially-retained region is removed by the ashing process, in this way, the process of re-exposing the photoresist pattern is saved, and thus the production cost is reduced.

Figure 7D:
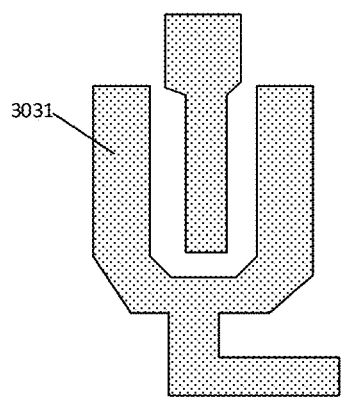

As illustrated in FIG. 7D, the photoresist in the photoresist-partially-retained region is removed.

For example, there is a U-shaped slit in the mask plate, and the U-shaped slit is used for light diffraction. After ashing, the material of the photoresist layer corresponding to the slit in the U-shaped slit is removed.

S106: etching the film to be patterned corresponding to the photoresist-partially-retained region to form the patterned film layer.

In step S106, the film to be patterned corresponding to the slit of the mask plate is removed.

In addition, the experiment proves that the compensation effect is good in a case that the width of the photoresist pattern corresponding to the extension portion of the mask plate is more than 1/5 or 1/10 of the width of the photoresist pattern corresponding to the connecting portion of the mask plate. That is, the width (the width of the extension portion in the direction perpendicular to the first sidewall and the second sidewall) of the extension portion of the mask plate is more than 1/10 or 1/5 and less than 1/2 of the width (the distance between the first sidewall and the second sidewall substantially parallel to each other) of the connecting portion.

For example, the patterned film layer is cleaned by an etching method, the patterned film layer covered by the photoresist pattern is retained, and the patterned film layer not covered by the photoresist pattern is removed to form the patterned film layer. The patterned film layer has a pattern corresponding to the photoresist pattern, that is, the patterned film layer includes a pattern corresponding to the first pattern and the second pattern of the mask plate.

For example, before forming the patterned film layer, the method further comprises: removing the material on the patterned film layer corresponding to the extension portion of the mask plate. For example, a portion of the film to be patterned corresponding to the extension portion is removed by a photolithography and etching method. It should be noted that, because the patterned film layer corresponding to the extension portion is a dummy pattern, in this way, the film corresponding to the extension portion can may also not be removed without affecting the circuit layout.

Alternatively, after the step of forming the patterned film layer by the etching method, the method further includes: removing a portion of the patterned film layer corresponding to the extension portion of the mask plate.

For example, the portion of the film to be patterned corresponding to the extension portion is removed by the photolithography and etching method.

For example, the patterned film layer is a conductive film, an organic insulating layer or an inorganic insulating layer.

At least one embodiment of the present disclosure further provides a method for manufacturing a thin film transistor, and the method comprises: forming a patterned film layer by adopting the manufacturing method of the patterned film layer described in above embodiments. The following example is illustrated by using the patterned film layer as conductive material.

Table 1 shows the test results of the HT (photoresist thickness) of the TFT structure. It can be seen from Table 1, in a case that the conductive pattern has no conductive extension portion, the HT at position 5 is lower than that at positions 1 to 4 by about 1000 Å at average, in this way, the SSM-TFT structure has a risk that the photoresist breaks in the process of mass production.

TABLE 1

| | HTM | | | | |
| --- | --- | --- | --- | --- | --- |
| | Point1 | Point2 | Point3 | Point4 | Point5 |
| Average | 6329 | 6209 | 6386 | 6253 | 5129 |
| Max | 8014 | 8062 | 8407 | 8171 | 7266 |
| Min | 4790 | 4725 | 4828 | 4782 | 2647 |
| 3Sigma | 2893 | 2920 | 2971 | 2950 | 3650 |

It can be seen from above, in the process of manufacturing a thin film transistor, it is necessary to avoid "bolt effect" by using the conventional manufacturing method. By improving the mask plate, an extension portion is added at the tip of the U-shaped pattern, in this way, the pattern of the photoresist formed by the mask plate also has an extension portion. In the process of hot baking, the extension portion of the photoresist is hot baked and flows to a region corresponding to the U-shaped pattern, in this way, the thickness of the photoresist pattern after exposure is guaranteed, and the problem that more diffraction light transmitted through the gap at the tip of the U-shaped due to the shape of the gap at the tip of the U-shaped groove of the mask plate is different from that at other positions is avoided, and further the problem that the photoresist corresponding to the tip of the U-shaped groove of the mask plate is prone to be broken due to the region has large exposure amount is avoided.

For example, the thin film transistor is a bottom-gate type thin film transistor or a top-gate type thin film transistor, and the thin film transistor comprises a gate electrode, a gate insulating layer, an active layer, a first source/drain electrode and a second source/drain electrode.

In one embodiment of the present disclosure, the thin film transistor is a thin film transistor located in the substrate region of the gate electrode driving circuit, or a thin film transistor located in the display region.

The mask plate, the method for manufacturing the patterned film layer and the method for manufacturing the thin film transistor provided by at least one embodiment have at least one of the following beneficial effects:

(1) in the mask plate provided by at least one embodiment of the present disclosure, the extension portion is added at the center of the bottom of the first pattern, in a case that the positive photoresist is used, the pattern of the photoresist formed by the mask plate also has an extension portion, thus the "bolt effect" is avoided.

(2) in the process of hot baking the photoresist pattern by using the mask plate provided by at least one embodiment of the present disclosure, the photoresist corresponding to the extension portion of the mask is hot baked and flows to a region corresponding to the gap between the bottom of the first pattern and the second pattern of the mask plate, thus, the integrity of the photoresist pattern after exposure is guaranteed.

(3) the mask plate provided by at least one embodiment of the present disclosure solves the problem that more diffraction light transmitted through the gap at the tip of the U-shaped due to the shape of the gap at the tip of the U-shaped groove of the mask plate is different from that at other positions, and further the problem that the photoresist corresponding to the tip of the U-shaped groove of the mask plate is prone to be broken due to the region has large exposure amount and the photoresist is thinner after exposure.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished, it is understood that in a case that elements such as layers, membranes, regions, or substrates are referred to as being located "up" or "down" on another element, the element may be "directly" located "up" or "down" on another element, or intermediate elements may exist; and (3) the embodiments of the present disclosure and the features therein can be combined with each other in the absence of conflict.

What is described above is related to only the illustrative embodiments of the disclosure and not limitative to the scope of the disclosure. The scopes of the disclosure are defined by the accompanying claims.

What is claimed is:

1. A mask plate, comprising:
a first pattern and a second pattern, wherein:
the first pattern comprises a first sidewall, a second sidewall, a connecting portion connecting both the first sidewall and the second sidewall, and an extension portion on a side of the connecting portion away from the first sidewall;
the second pattern is between the first sidewall and the second sidewall;
a slit is between the first pattern and the second pattern, and the slit is configured for diffraction; and
the extension portion is connected to a center of the connecting portion, and the first sidewall and the second sidewall are axisymmetric about a central axis of the first pattern, and a part of the extension portion parallel to the central axis is axisymmetric about the central axis.

2. The mask plate according to claim 1, wherein a plurality of first patterns and a plurality of second patterns are provided, and the plurality of first patterns are in a one to one correspondence with the plurality of second patterns.

3. The mask plate according to claim 2, wherein the plurality of the first patterns are connected to each other.

4. The mask plate according to claim 3, wherein a plurality of extension portions are provided, and each of the first patterns is provided with one of the extension portions.

5. The mask plate according to claim 2, wherein a plurality of extension portions are provided, and each of the first patterns is provided with one of the extension portions.

6. The mask plate according to claim 1, wherein the extension portion is an L-shaped structure.

7. The mask plate according to claim 1, wherein the first sidewall and the second sidewall are parallel to each other, and a width of the extension portion in a direction perpendicular to the first sidewall and the second sidewall is $1/10$ to $1/2$ of a distance between the first sidewall and the second sidewall.

8. The mask plate according to claim 1, wherein a width of the slit is from 1.9 μm to 2.4 μm.

9. The mask plate according to claim 8, wherein the width of the slit is from 2.1 μm to 2.3 μm.

10. A method for manufacturing a patterned film layer, comprising:
depositing a film to be patterned and a photoresist film in sequence;
patterning the photoresist film to form a photoresist pattern by using a mask plate, wherein the mask plate comprises a first pattern and a second pattern, the first pattern comprises a first sidewall, a second sidewall, a connecting portion connecting both the first sidewall and the second sidewall, and an extension portion on a side of the connecting portion away from the first sidewall, the second pattern is between the first sidewall and the second sidewall, a slit is between the first pattern and the second pattern, and the slit is configured for diffraction, and wherein the photoresist pattern comprises a photoresist-completely-retained region, a photoresist-partially-retained region, and a photoresist-completely-removed region;
hot baking the photoresist pattern, wherein a photoresist corresponding to the extension portion of the mask plate flows to a position corresponding to a region between the connecting portion and the second pattern of the mask plate;
etching the film to be patterned corresponding to the photoresist-completely-removed region;
ashing the photoresist-partially-retained region to remove the photoresist in the photoresist-partially-retained region; and etching the film to be patterned corresponding to the photoresist-partially-retained region to form the patterned film layer.

11. The method according to claim 10, wherein the photoresist-completely-retained region corresponds to the first pattern and the second pattern of the mask plate, and the photoresist-partially-retained region corresponds to the slit of the mask plate.

12. The method according to claim 11, wherein a thickness of the photoresist in the photoresist-partially-retained region is ¼ to ½ of a thickness of the photoresist in the photoresist-completely-retained region.

13. The method according to claim 10, wherein before the hot baking the photoresist pattern, the photoresist in the photoresist-partially-retained region has a first portion and a second portion with different thicknesses.

14. The method according to claim 13, wherein the first portion corresponds to a gap between the first sidewall and the second pattern of the mask plate, and a gap between the second sidewall and the second pattern; and the second portion corresponds to a gap between the connecting portion and the second pattern of the mask plate.

15. The method according to claim 13, wherein a thickness difference between the first portion and the second portion is from 50 nm to 100 nm.

16. The method according to claim 10, wherein after the patterned film layer is formed, the method further comprises: removing a portion of the patterned film layer corresponding to the extension portion of the mask plate.

17. The method according to claim 10, wherein the patterned film layer is a conductive film, an organic insulating layer or an inorganic insulating layer.

18. A method of manufacturing a thin film transistor, comprising: forming the patterned film layer by the method according to claim 10.

* * * * *